US011195713B2

(12) United States Patent
Hirschler et al.

(10) Patent No.: US 11,195,713 B2
(45) Date of Patent: Dec. 7, 2021

(54) METHODS OF FORMING A SILICON-INSULATOR LAYER AND SEMICONDUCTOR DEVICE HAVING THE SAME

(71) Applicant: Infineon Technologies AG, Neubiberg (DE)

(72) Inventors: Joachim Hirschler, Villach (AT);
Georg Ehrentraut, Villach (AT);
Christoffer Erbert, St. Magdalen (AT);
Klaus Goeschl, Klagenfurth (AT);
Markus Heinrici, Villach (AT);
Michael Hutzler, Villach (AT);
Wolfgang Koell, Ledenitzen (AT);
Stefan Krivec, Arnoldstein (AT);
Ingmar Neumann, Villach (AT);
Mathias Plappert, Drobollach (AT);
Michael Roesner, Villach (AT); Olaf Storbeck, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 16/426,051

(22) Filed: May 30, 2019

(65) Prior Publication Data
US 2019/0385842 A1    Dec. 19, 2019

(30) Foreign Application Priority Data

Jun. 13, 2018  (DE) .......................... 102018114111.4
Sep. 19, 2018  (DE) .......................... 102018122979.8

(51) Int. Cl.
*H01L 21/02* (2006.01)
*H01L 29/51* (2006.01)
(Continued)

(52) U.S. Cl.
CPC .... *H01L 21/02252* (2013.01); *H01L 21/0214* (2013.01); *H01L 21/0217* (2013.01);
(Continued)

(58) Field of Classification Search
CPC ......... H01L 21/02252; H01L 21/02164; H01L 21/0217; H01L 21/0214; H01L 29/518;
(Continued)

(56) References Cited

U.S. PATENT DOCUMENTS 4,300,989 A   11/1981  Chang
4,409,260 A   10/1983  Pastor et al.
(Continued)

OTHER PUBLICATIONS

Wang, Chenxi, et al., "Room-Temperature Direct Bonding Using Fluorine Containing Plasma Activation", Journal of The Electrochemical Society, vol. 158, Iss. 5, 2011, pp. H525-H529.

*Primary Examiner* — Su C Kim
(74) *Attorney, Agent, or Firm* — Murphy, Bilak & Homiller, PLLC

(57) ABSTRACT

In one aspect, a method of forming a silicon-insulator layer is provided. The method includes arranging a silicon structure in a plasma etch process chamber and applying a plasma to the silicon structure in the plasma etch process chamber at a temperature of the silicon structure equal to or below 100° C. The plasma includes a component and a halogen derivate, thereby forming the silicon-insulator layer. The silicon-insulator layer includes silicon and the component. In another aspect, a semiconductor device is provided having a silicon-insulator layer formed by the method.

15 Claims, 8 Drawing Sheets

(51) Int. Cl.
*H01L 21/28* (2006.01)
*H01L 21/18* (2006.01)
*H01L 29/49* (2006.01)

(52) U.S. Cl.
CPC ...... *H01L 21/02164* (2013.01); *H01L 21/187* (2013.01); *H01L 21/28079* (2013.01); *H01L 21/28194* (2013.01); *H01L 29/495* (2013.01); *H01L 29/51* (2013.01); *H01L 29/518* (2013.01)

(58) Field of Classification Search
CPC ............. H01L 21/28194; H01L 21/187; H01L 29/495; H01L 29/51; H01L 21/28079; H01L 21/28211; H01L 21/28202; H01L 29/66568; H01L 21/02238; H01L 21/32; H01L 21/76251
See application file for complete search history.

(56) References Cited

U.S. PATENT DOCUMENTS

| | | |
|---|---|---|
| 4,818,327 A | 4/1989 | Davis et al. |
| 5,037,514 A | 8/1991 | Yamazaki |
| 2002/0160623 A1 | 10/2002 | Kakkad |
| 2007/0065593 A1 | 3/2007 | Wajda et al. |
| 2007/0216042 A1* | 9/2007 | Delprat ............. H01L 21/76254 438/471 |
| 2009/0286364 A1* | 11/2009 | Hong ................... H01L 29/51 438/197 |
| 2009/0309156 A1 | 12/2009 | Darwish et al. |
| 2013/0089968 A1* | 4/2013 | Usenko ............... H01L 21/3065 438/458 |
| 2014/0008711 A1 | 1/2014 | Park |
| 2016/0141204 A1 | 5/2016 | Kawahara et al. |

\* cited by examiner

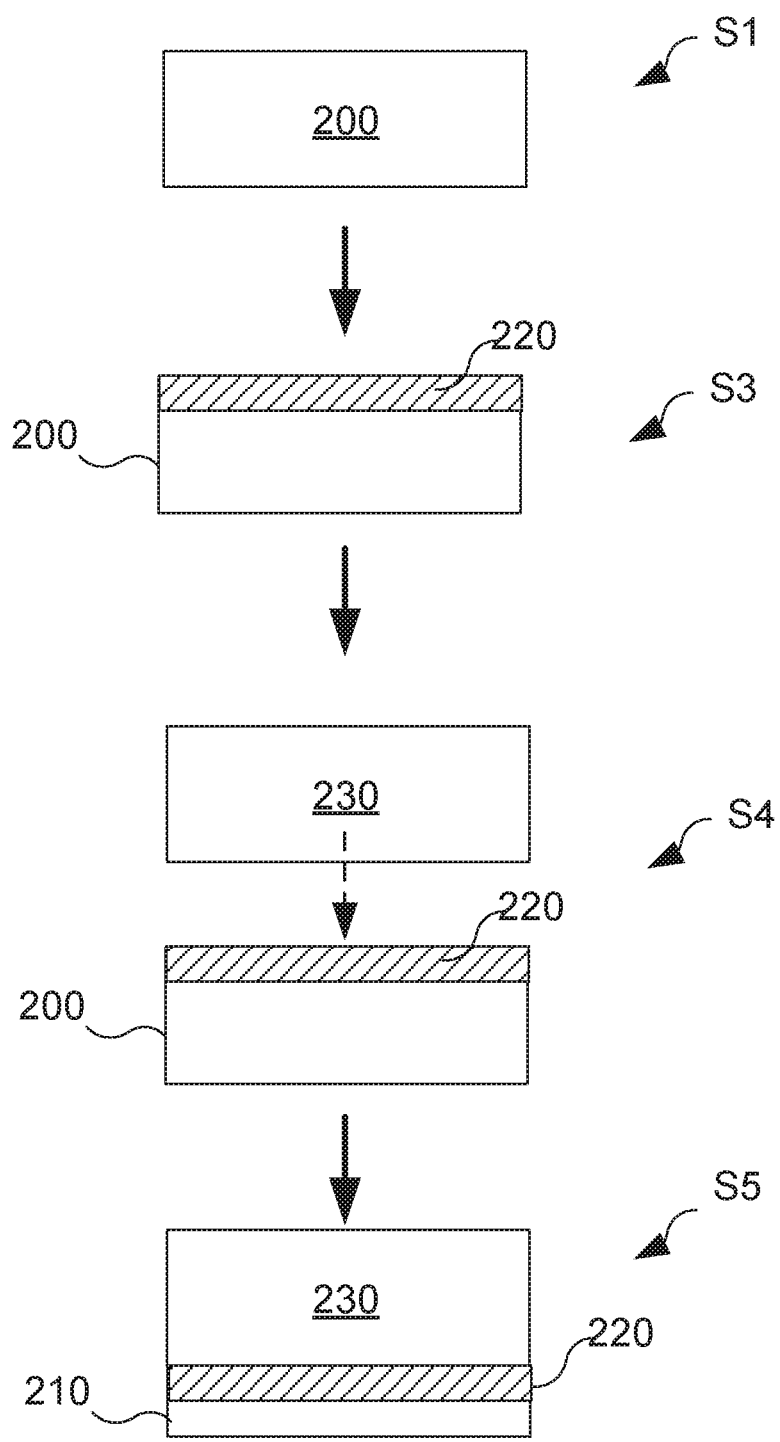

METHODS OF FORMING A SILICON-INSULATOR LAYER AND SEMICONDUCTOR DEVICE HAVING THE SAME

TECHNICAL FIELD

Various embodiments relate generally to methods of forming a silicon-insulator layer and a semiconductor device having the same.

BACKGROUND

For some applications, standard oxidation processes of silicon, such as thermal oxidation at temperatures well above 400° C., cannot be used in semiconductor device manufacturing because other parts of the semiconductor device, e.g. bare metal structures, are not able to withstand such elevated temperature without oxidizing.

Further, in semiconductor industry the general boron level in the clean room can effect electrical behavior of sensitive silicon layers.

Even further, certain process flows in semiconductor technologies aim to minimize thermal budget in order to minimize out diffusion of dopants.

Even further, in semiconductor industry for special process flows healing surface damage of Si, e.g. caused by chemical mechanical polishing (CMP), are problematic.

SUMMARY

In one aspect, a method of forming a silicon-insulator layer is provided. The method includes an arranging of a silicon structure in a plasma etch process chamber and includes applying a plasma to the silicon structure in the plasma etch process chamber at a temperature of the silicon structure equal to or below 100° C. The plasma includes a component and a halogen derivate, thereby forming the silicon-insulator layer. The silicon-insulator layer includes silicon and the component. In another aspect, a semiconductor device is provided having a silicon-insulator layer formed by the method.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows schematic cross section views of a silicon wafer in a method of processing a semiconductor device according to various embodiments;

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

Figure 1A:
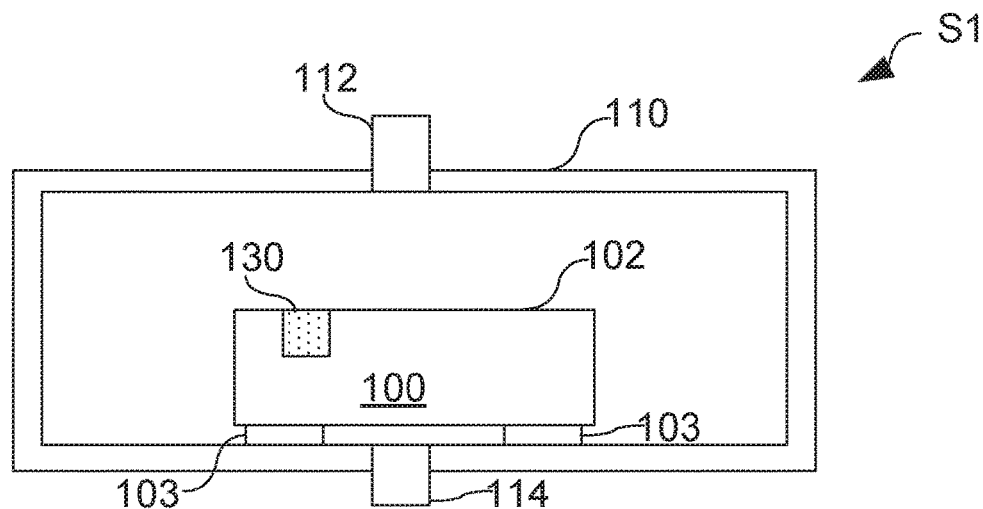
FIGS. 1A, 1B and 1C show schematic cross section views of a silicon structure in a method of forming a silicon-insulator layer according to various embodiments.
Figure 1B:
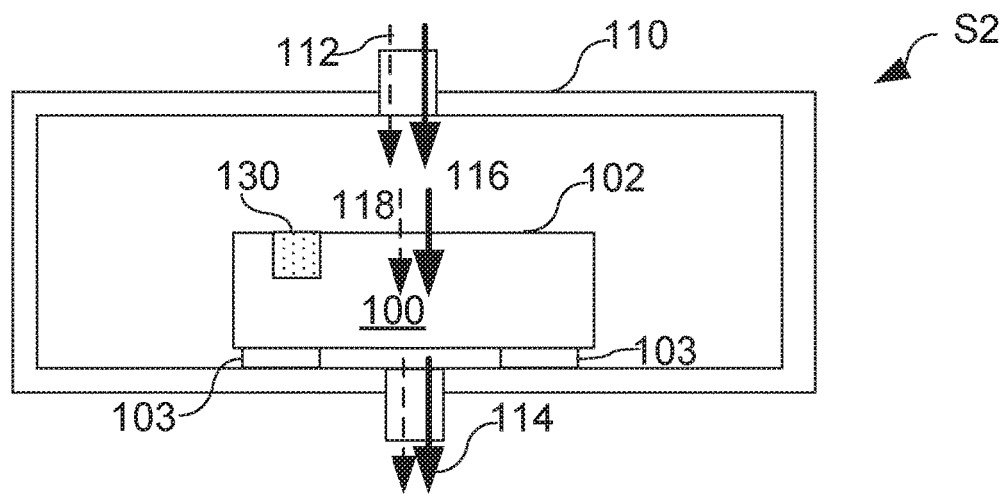
Figure 1C:
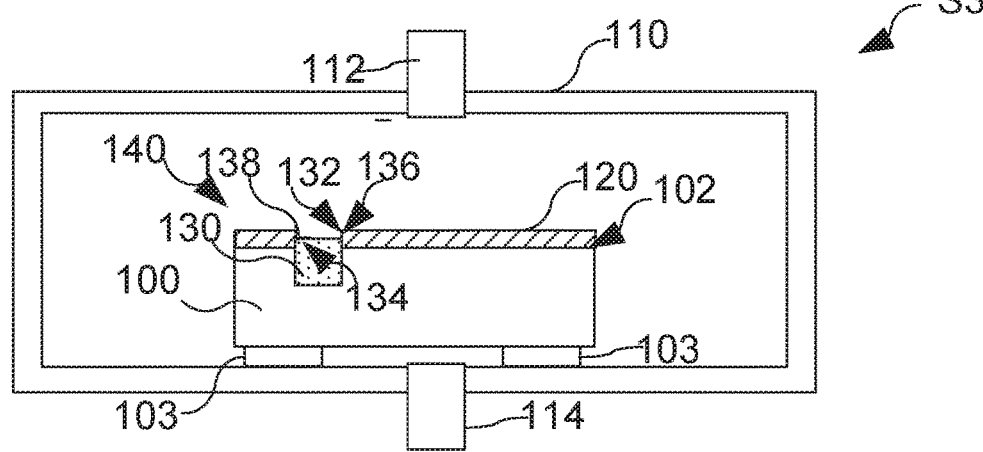

FIG. 1A, FIG. 1B and FIG. 1C show schematic cross section views of a silicon structure 100 in a method of forming a silicon-insulator layer 120 according to various embodiments. The method allows to oxidize silicon at low temperature without damaging other temperature sensitive parts of the device. Further, the method allows to form a thin and low temperature grown oxide layer that can effectively prevent contamination of a clean room in view of the general boron level. Even further, the method allows to oxidize silicon substantially without thermally activated parasitic processes, such as e.g. thermal diffusion, recrystallization or melting of metals, decomposition of organic compounds, e.g. at a temperature of less than 100° C. Thus, this method is advantageous in certain process flows in semiconductor technologies that aim to minimize thermal budget in order to minimize out diffusion of dopants. Even further, the method allows healing of Si surface damage e.g. caused by chemical mechanical polishing (CMP) in special process flows in semiconductor industry. Even further the layer allows to act as protection layer against diffusion from subsequentially processed layers. Even further the layer can act as adhesion promotor to subsequentially processed layers or package materials. Even further the layer can act as getter layer for unwanted elements or chemical compounds at interfaces.

The method may include an arranging of the silicon structure 100 in a plasma etch process chamber 110, illustrated as S1 in FIG. 1A. The silicon structure 100 may be supported by one or more supports 103, e.g. one or more feet structures. In addition or as an alternative, the silicon structure 100 may be supported by a chuck (not shown in the figures). The chuck may be a simple pedestal or an electrostatic chuck being operated with a self-bias voltage or in addition with an additional bias voltage. It has been found out that by providing an electrostatic chuck with an additional bias voltage it was possible to form an even thicker silicon-insulator layer than by providing an electrostatic chuck with a self-bias voltage. The silicon structure 100 has a surface 102. The silicon structure may consist or include polycrystalline or single crystalline silicon. The layer or material underneath may also include or essentially consist of SiC, GaN, $Si_3N_4$ or $SiO_2$ itself, or any other suitable material such as e.g. Ti, TiN, W, WN, Al, Cu, etc. In various embodiments, the silicon structure 100 may include a metal 130, wherein a metal surface is exposed. The metal may include or essentially consists of tungsten, as example.

In various embodiments, the plasma etch process chamber 110 may be part of a plasma etcher or etching tool that could be an isotropic without sputter component or a non-isotropic reactive-ion etching (RIE) tool.

In various embodiments, the plasma etch process chamber 110 may be part of an ion implantation tool or plasma depositioning tool. In these cases, the plasma etch process chamber 110 may be denoted as ion implantation chamber or plasma depositioning chamber.

The plasma etch process chamber 110 is configured to produce a plasma from a process gas using a high frequency electric field. The plasma etch process chamber 110 may have a gas inlet 112 and a gas outlet 114. The gas inlet 112 is configured to provide the process gas from the outside to the inside of the plasma etch process chamber 110. The gas outlet 114 is configured to remove the process gas from the inside to the outside of the plasma etch process chamber 110. The gas inlet 112 may be implemented as a gas shower at the top of the plasma etch process chamber 110 and may run through a top housing wall of the same. Furthermore, the plasma etch process chamber 110 may further include a gas suction component (not shown) coupled to the gas outlet 114 to suck gas out of the plasma etch process chamber 110 through the gas outlet 114 to the environment of the plasma etch process chamber 110.

Further, the plasma etcher or etching tool may have a device configured to generate the high frequency electric field. The plasma etcher or etching tool may further be configured to adjust and/or control one or more of the following parameters of the plasma etcher or etching tool: high frequency power, the molar concentration of the constituents of the process gas, vacuum, electrostatic chuck, temperature and/or the molar concentration of the constituents of the process gas provided to the gas inlet 112 depending on the used halogen derivate, component and desired application (described in more detail below). As example, the gas inlet 112 and the controller may be configured to provide a gas flow of the process gas having at least two constituents into the plasma etch process chamber 110, wherein the at least two constituents form the halogen derivate and the component in the plasma.

In various embodiments, air is evacuated from the plasma etch process chamber 110 using a system of vacuum pumps before the process gas is introduced at low pressure into the plasma etch process chamber 110 via the gas inlet 112. In other embodiments, the etching tool or plasma etcher may be an open air plasma and air is not evacuated from the plasma etch process chamber 110.

The method further includes applying a plasma to the silicon structure 100 in the plasma etch process chamber 110, illustrated as S2 in FIG. 1B.

The plasma contains the component 116 and the halogen derivate 118. In various embodiments, the molar concentration of the component 116 in the plasma is higher than the molar concentration of the halogen derivate 118 in the plasma.

In various embodiments, the molar concentration of the halogen derivate may be in a range of 0.001% to 50%, e.g. in a range of 0.01% to 25%, e.g. in a range of 0.1% to 10%, e.g. in a range of 1% to 5%. This way, the halogen derivate 118 may act as a catalyst for the diffusion of the component 118 into the silicon structure 100. The halogen may additionally support by surface reaction, surface conditioning or surface adhesion.

In various embodiments, the component 116 may include or essentially consists of oxygen ions, nitrogen ions, carbon ions and/or derivates thereof. The oxygen ions may be based on molecular oxygen and the nitrogen ions may be based on molecular nitrogen.

In various embodiments, the halogen derivate 116 may include or essentially consist of fluorine ions. The fluorine ions may be based on any fluorine containing process gas, e.g. one of the following molecules in the process gas: $CF_4$, $SF_6$, $NF_3$, $CHF_3$, $C_2F_6$, $C_4F_8$, $C_4F_5$, and/or mixtures of two or more thereof.

The silicon structure 100 may be heated, e.g. by a hot plate arranged in the plasma etch process chamber 110, at a temperature of the silicon structure 100 equal to or below 100° C. In various embodiments, the plasma may be applied to the silicon structure 100 at a temperature of the silicon structure 100 in the range from about 10° C. to about 90° C., e.g. in the range from about 20° C. to about 80° C., e.g. in the range from about 20° C. to about 25° C., e.g. room temperature.

The silicon-insulator layer 120 is formed by the plasma. That is, the component 118 is diffusing from the plasma into the silicon structure 100 wherein the halogen derivate 116 is acting as a catalyst. Since the temperature of the silicon structure is below 100° C., the thermal stress in the silicon structure 100 is relatively low compared to thermal oxidation processes and the temperature of the silicon structure 100 is typically too low for the formation of unwanted insulating layers, e.g. an oxidation of an exposed metal 130 of the silicon structure 100. Otherwise, in case the metal would be oxidized, this often leads to a strong increase in volume. In other words, metal oxide typically has a larger volume than the pure metal itself. Further, the metal and metal oxide could outgas and contaminate the plasma etch process chamber 110. This, however, is avoided by the method according to various embodiments.

The silicon-insulator layer 120 may be formed to have a layer thickness in the range from about 2 nm to about 20 nm, e.g. in the range from about 2 nm to about 12 nm, e.g. in the range from about 2 nm to about 10 nm, e.g. in the range from about 2 nm to about 9 nm.

In a conventional plasma etching process, halogen derivates, e.g. fluorine ions, are used to etch the silicon structure 100, e.g. to remove a native silicon oxide layer from the bare silicon of the silicon structure. However, in various embodiments, the halogen derivate is used in a lower molar concentration than for etching the silicon structure 100 and, this way, the halogen derivate may act as a catalyst for the diffusion of the component. That is, the halogen derivate 116 promotes a radical diffusion of the component 118 deeper into the silicon structure, e.g. in a range of about 2 nm to 20 nm, e.g. in a range of about 2 nm to 12 nm, than in case of a plasma without halogen derivate. The diffusion deeper into the silicon structure refers to an exposed surface 102 of the silicon structure from which the component enters the silicon structure 100 (illustrated in FIG. 1B by the solid and dashed arrows 116, 118).

At the end of the plasma process, illustrated as S3 in FIG. 1C, the formed silicon-insulator layer 120 includes silicon and the component. The method may be used, as example, for forming a protection layer, e.g. the silicon-insulator layer 120; for using the silicon-insulator layer 120 as an adhesion promoter e.g. with silicon oxide in direct wafer bonding; for healing of silicon surface damages and/or for suppressing surface leakage currents, for preventing out diffusion of implanted elements using the silicon-insulator layer 120; and/or for a controlled generation of a thin oxide layer at a relatively low temperature in presence of exposed metal 130, as further described in detail below.

In various embodiments, an exposed metal 130 remains substantially unchanged by the applied plasma in S2. This way, a silicon-insulator layer 120 may be formed on silicon of a silicon structure 100 while leaving an exposed metal 130 next to or adjacent to the silicon unchanged.

Since silicon is consumed during oxidation, a part of the silicon-insulator layer 120 is formed having a larger height than the metal 130. Illustratively, the plasma process forms the silicon-insulator layer 120 selectively on the exposed surface 102 of the silicon structure (but not on the metal 130, thereby remaining the exposed surface 134 of the metal 130 substantially free from the silicon-insulator layer 120). Thus, a step (as one example of a sharp edge) 132 may be formed between the metal 130 and the silicon-insulator layer 120. The step may have a substantially vertical sidewall 136. In various embodiments, an angle 138 between the exposed surface 134 of the metal 130 and the sidewall 136 may be in the range from about 45° to about 120°, e.g. in the range from about 60° to about 100°, e.g. in the range from about 75° to about 95°, e.g. in the range from about 85° to about 90°.

FIG. 2 shows schematic cross section views of a silicon wafer 200 in a method of processing a semiconductor device according to various embodiments.

The method may include a providing of a first wafer 200 (S1) and a forming of a silicon-insulator layer 220 on the first wafer 200 (S3), e.g. according to an embodiment described above.

The method may further include an adhering of a second wafer 230 to the first wafer 200 by fixing the silicon-insulator layer 220 to a surface of the second wafer (S4), e.g. by means of an ultrasonic or thermosonic welding or bonding.

Thereafter, the first wafer 200 and/or the second wafer 230 may be reduced in thickness (S5), e.g. by means of back polishing the first wafer 210 from a first thickness to a second thickness lower than the first thickness.

In various embodiments, this way, a metal (see above) may be positioned or buried between the first wafer 200, 210 and the second wafer 230.

Figure 3:
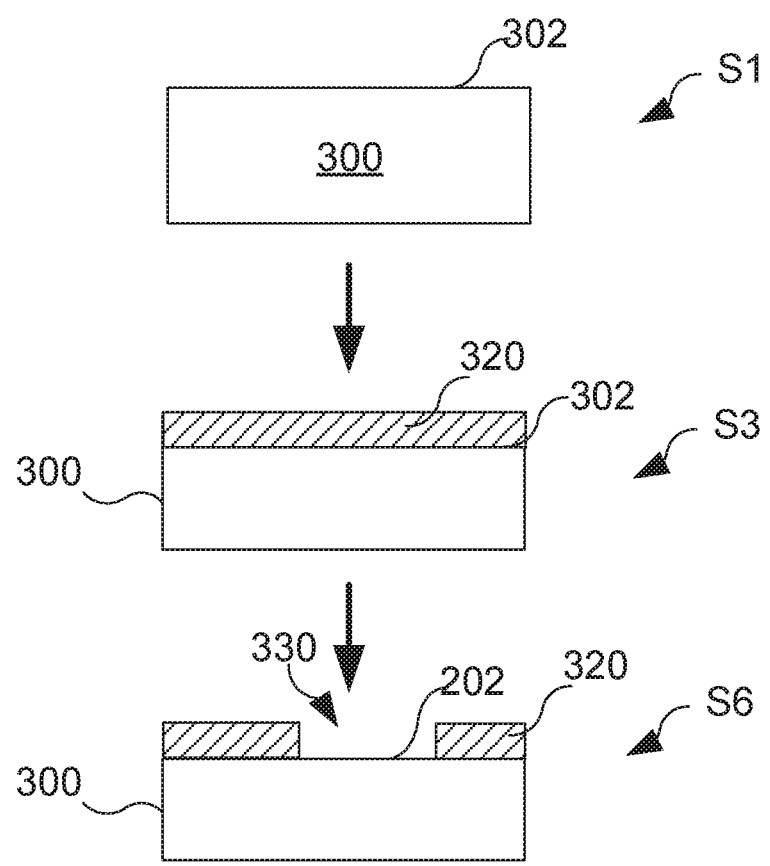
FIG. 3 shows schematic cross section views of a semiconductor device in a method of processing a semiconductor device according to various embodiments.

FIG. 3 shows schematic cross section views of a semiconductor device in a method of processing a semiconductor device according to various embodiments.

In various embodiments, the method may further include, after providing a semiconductor surface 300 (S1) and forming of the silicon-insulator layer 320 (S3), e.g. as described above, at least a partially removing the silicon-insulator layer 320 from the semiconductor surface 302 (S6 illustrated in FIG. 3). That is, an exposed region 330 having an exposed part of the surface 302 may be formed after forming the silicon-insulator layer 320. This way, surface defects of the semiconductor surface 300 provided in S1 may be removed in the exposed region 330 by removing the silicon-insulator layer 320 from the semiconductor surface 200 buried beneath the silicon-insulator layer 320 in S3.

Figure 4:
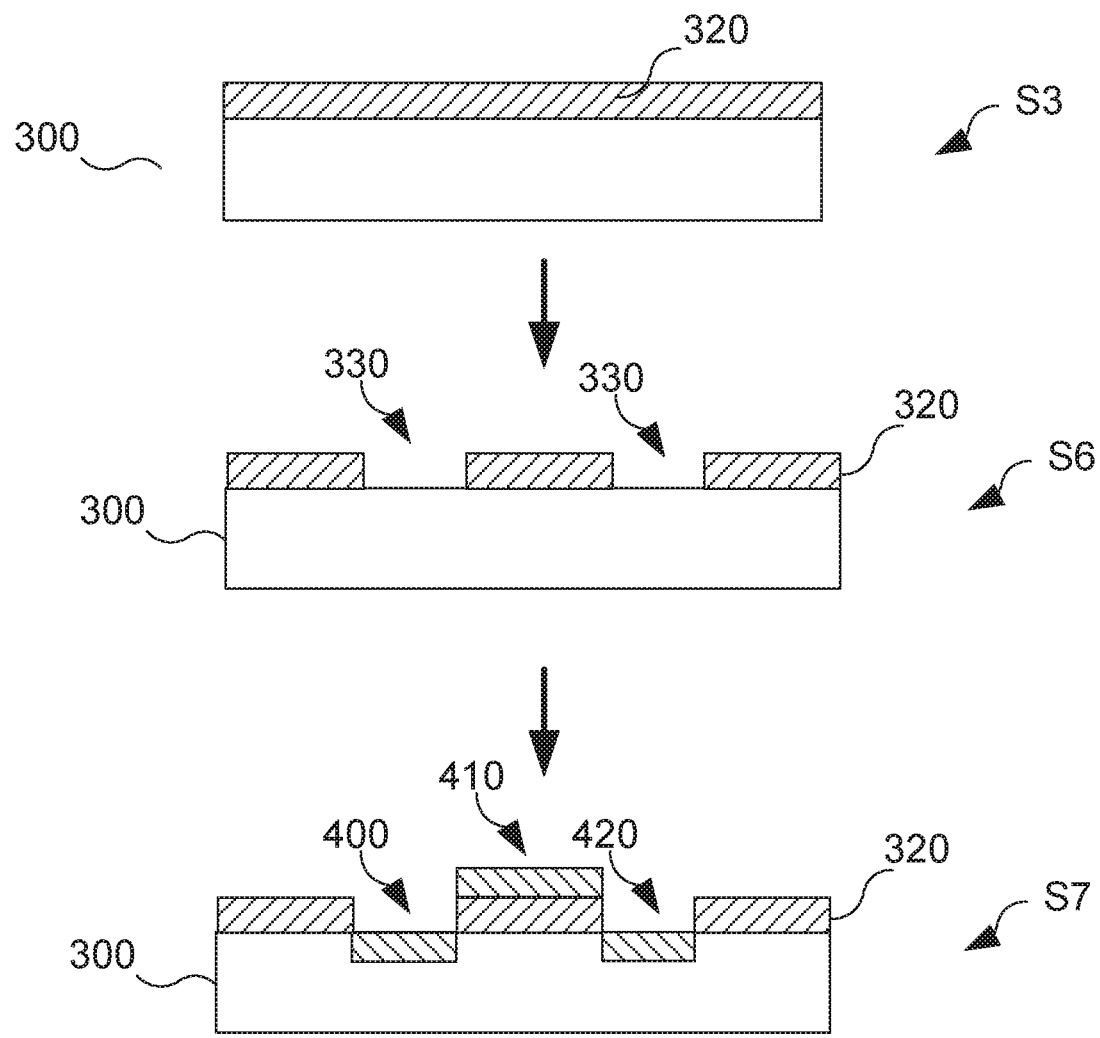
FIG. 4 shows schematic cross section views of a semiconductor device in a method of forming a semiconductor device according to various embodiments.

FIG. 4 shows schematic cross section views of a semiconductor device in a method of forming a semiconductor device according to various embodiments. The method illustrated in FIG. 4 may be a continuation of the method illustrated in FIG. 3.

In various embodiments, the method may further include, after forming the silicon-insulator layer 320 in S3 and partially removing the silicon-insulator layer 320 from the semiconductor surface in S6, a forming a first controlled region 400, a second controlled region 420 and a control region 410 of the semiconductor device (S7 illustrated in FIG. 4).

In various embodiments, the semiconductor device is a transistor, e.g. a field effect transistor. The first controlled region 400 may be formed as a source region of the field effect transistor; the second controlled region 420 may be formed as a drain region of the field effect transistor; and the control region 410 may be formed as a gate region of the field effect transistor. In various embodiments, the metal 130 illustrated in FIG. 1, may form or may be used to form the control region 410 of the semiconductor device.

Figure 5:
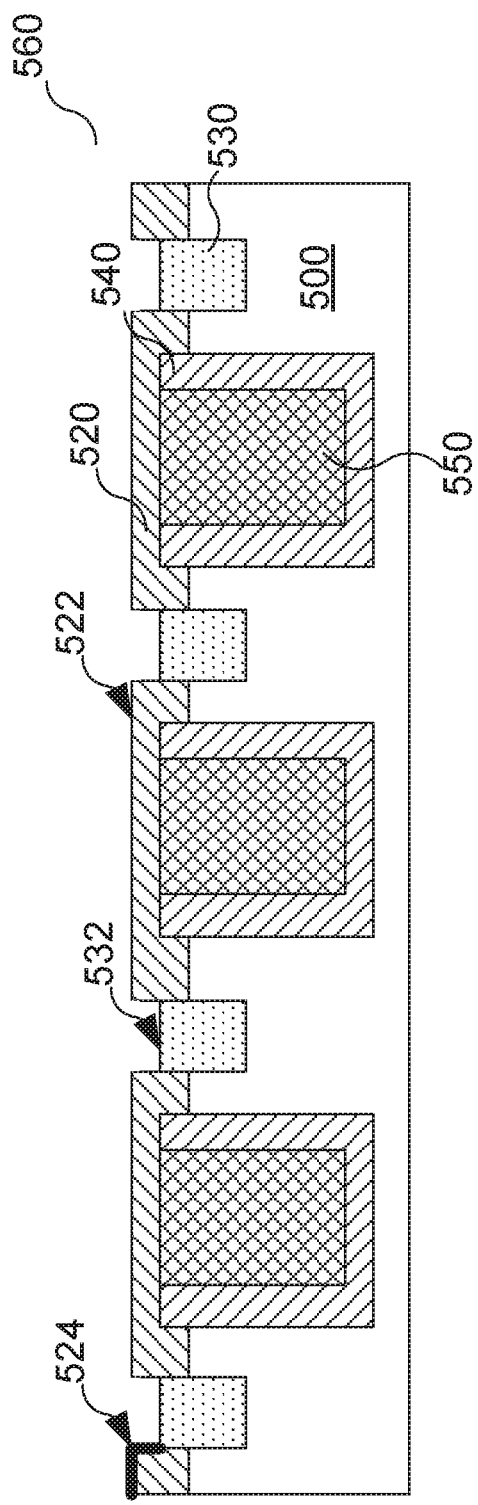
FIG. 5 show a schematic cross section view of a semiconductor structure according to various embodiments.

FIG. 5 shows a schematic cross section view of a semiconductor structure 560 according to various embodiments. The semiconductor structure 560 may be formed based on an embodiment of a method described above.

In various embodiments, the semiconductor structure 560 includes a silicon structure 500 (silicon base material) including a metal portion 530, a trench region 550 having silicon and a silicon doped area 540. A metal surface 532 of the metal portion 530 is free from a metal insulating compound. The semiconductor structure further includes a silicon-insulator layer 520 adjacent to the metal portion 530. A top surface 522 of the silicon-insulator layer 520 is higher than the metal surface 532. The silicon-insulator layer 520 forms a sharp edge 524 with respect to the metal surface 532 so that the metal surface 532 of the metal portion 530 is also free from the silicon-insulator layer 520.

However, the metal portion 530 may have a native metal insulating compound at the metal surface 532. That is, the metal portion 530 is substantially free of metal insulating compound. In various embodiments, the thickness of a present native metal insulating compound is not increased or not substantially increased by the formation of the silicon-insulator layer 520.

In various embodiments, the silicon-insulator layer 520 may partially overlap the metal portion 530. That is, the sharp edge 524 may have a curvature. Further, the overlapping part of silicon-insulator layer 520 may physically contact the metal surface 532 of the metal portion 530. In addition, the silicon-layer 520 may be formed of a material that is a metal insulating compound. However, this scenario is not considered as growing of metal insulating compound on the metal surface 532 of the metal portion 530.

The metal insulating compound may include or essentially consists of a metal oxide, a metal nitride and/or a metal oxynitride.

In various embodiments, the silicon-insulator compound may include or essentially consists of a silicon oxide, a silicon nitride and/or a silicon oxynitride.

In various embodiments, the silicon-insulator layer 520 has a layer thickness in the range from about 2 nm to about 20 nm, e.g. in a range of about 2 nm to 12 nm, e.g. in the range from about 2 nm to about 10 nm, e.g. in the range from about 2 nm to about 9 nm.

In various embodiments, the metal portion 530 may form a control region of the semiconductor device.

In various embodiments, the semiconductor device may be a transistor. The metal portion 530 may form a control region of the transistor.

In various embodiments, the semiconductor device is a field effect transistor. The metal portion 530 may form a gate region of the field effect transistor.

Figure 6:
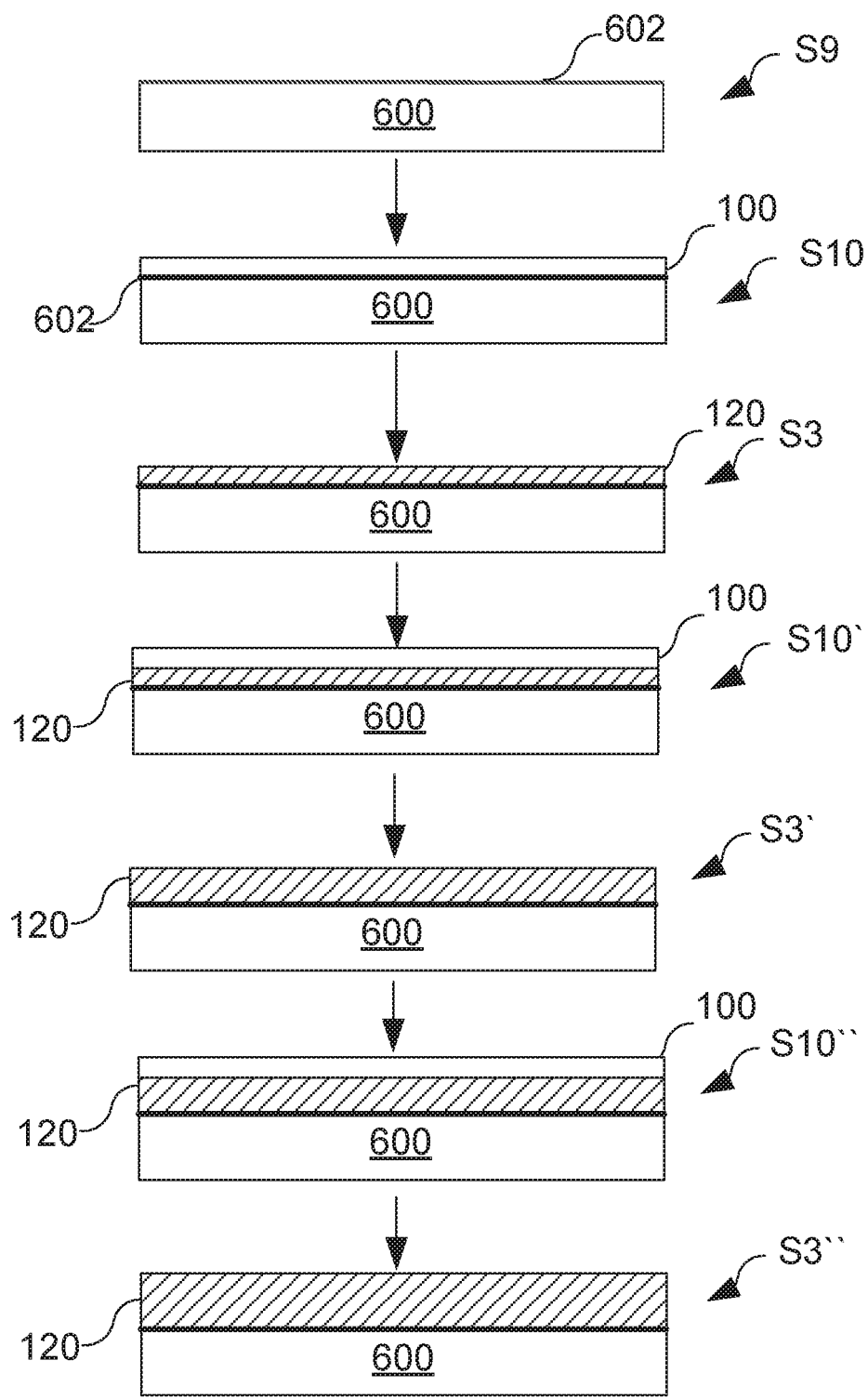
FIG. 6 shows schematic cross section views of a semiconductor device in a method of processing a semiconductor device according to various embodiments.

FIG. 6 shows schematic cross section views of a semiconductor device in a method of processing a semiconductor device according to various embodiments.

In various embodiments, the method may include a providing S9 of a substrate 600. The substrate may be a any desired substrat, as example, including or consisting of a metal, e.g. tungsten; a semiconductor, e.g. silicon carbide, gallium nitride, germanium carbide, graphene and/or graphite; a dielectric, e.g. an alumina, e.g. sapphire, a resist, e.g. a polyacrylate, a glass, e.g. a soda lime glass, or a polymer (foil), e.g. a polyolefin foil. The substrate 600 may have a native insulating layer 602, e.g. a native silicon oxide layer 602 in case of a silicon wafer as substrate 600. The native silicon oxide layer may have thickness of about 1 nm.

The method may further include a providing S10, e.g. forming of a silicon structure 100, e.g. a silicon layer 100 on the substrate 600, e.g. by a physical and/or chemical vapor deposition technique (PVD or CVD). The formed silicon layer 100 may be, as an example, an amorphous silicon (a-Si) layer formed by sputtering. The silicon layer 100 may be formed on the native oxide layer 602, as example. The silicon layer 100 may be formed having a thickness in a range between a monolayer and 20 nm, e.g. between 1 nm and 15 nm, e.g. between 5 nm and 7 nm.

The method may further include the formation S3 of the silicon-insulator layer 120 from the silicon structure 100, e.g. from the silicon layer 100, as described above. That is, the silicon layer 100 may be plasma oxidized into silicon oxide in a depth of up to 4 to 6 nm, as example. The formation S10, S10' and S10" of a silicon layer (structure) 100 and the subsequent formation S3, S3', S3" of the silicon-insulator layer 120 from the previously formed silicon layer 100 may than be repeated, e.g. alternatingly, as illustrated in FIG. 6. In other words, the formation S10 of a silicon layer 100 and the formation S3 of a silicon-insolation layer 100 from this silicon layer 100 may be repeated a plurality of times (in FIG. 6, three repetitions are illustrated). This way, the silicon-insulator layer 120 may be formed with a desired thickness (illustrated as S3" in FIG. 6). Each sequence of S10 and S3 may increase the thickness of the silicon-insulator layer 120 for about a few nm, as example. This way, a silicon-insulator layer 120 having a thickness in a range from e.g. 10 nm to 20 nm may be formed.

The silicon layer 100 and the silicon-insulator layer 120 may be formed at relatively low temperature, e.g. equal or below about 80° C. This way, the method may be open for a large variety of different substrates, as described above. In other words, the method may be substantially independent from the material of the substrate 600.

Figure 7:
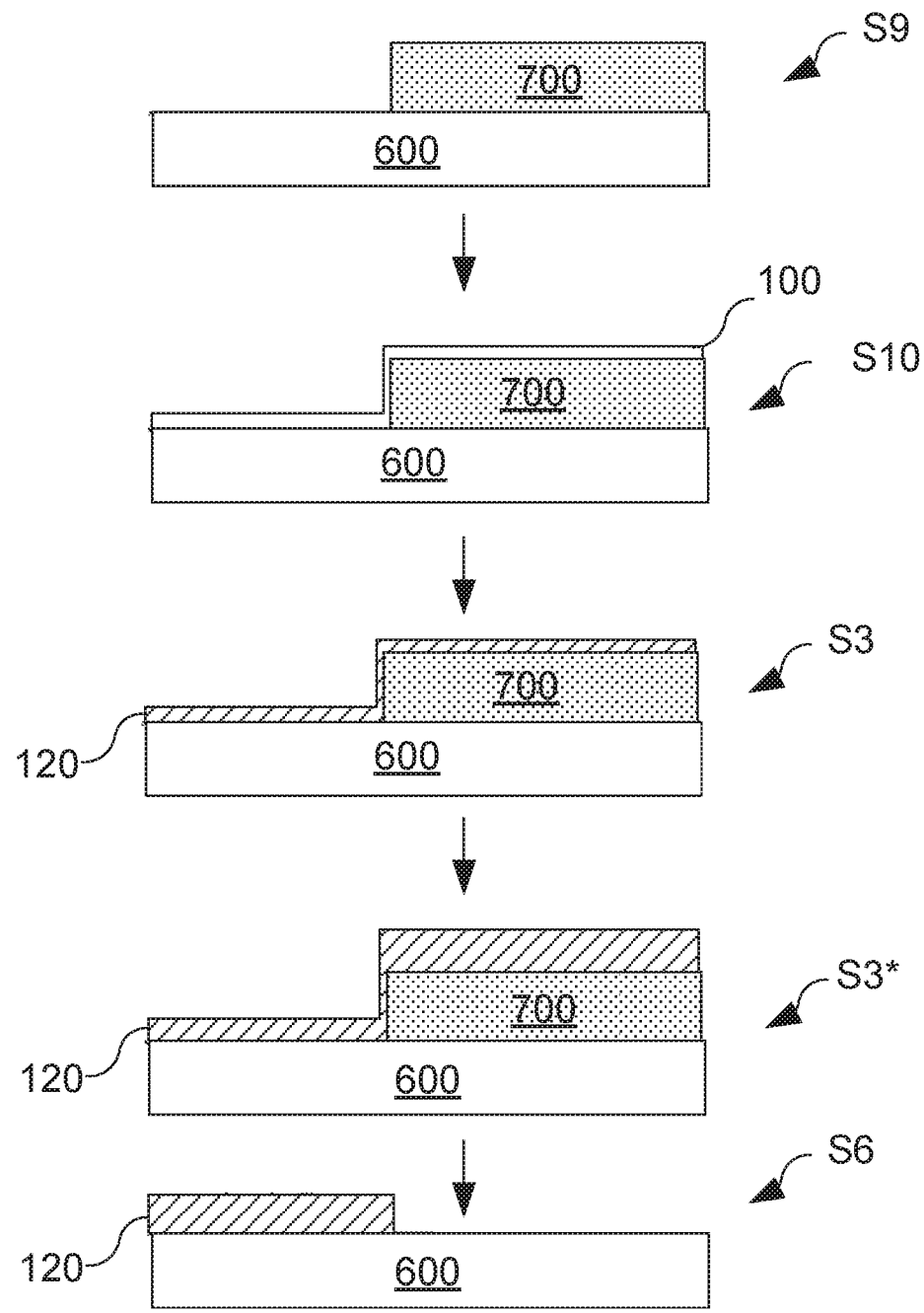
FIG. 7 shows schematic cross section views of a semiconductor device in a method of processing a semiconductor device according to various embodiments.

FIG. 7 shows schematic cross section views of a semiconductor device in a method of processing a semiconductor device according to various embodiments.

In addition to the above, in various embodiments, the substrate 600 may be provided including, having or consisting of a resist 700. The resist 700 may be formed or consist of a polymer and may be used as a mask or dummy layer in a lift-off process.

The silicon structure 100 may be formed on top of the substrate 600 and the resist 700. Again, the formation S10 of a silicon layer 100 and the formation S3 of a silicon-insulator layer 100 from this silicon layer 100 may be repeated a plurality of times (in FIG. 7 illustrated as transition from S3 to S3*). The repetition or sequence of repetitions may also be denoted as a layer-by-layer process of forming the silicon-insulator layer 120. Thus, the silicon-insulator layer 120 may be formed having a desired thickness.

In various embodiments, a laterally structured silicon-insulator layer 120 may be formed by removing the resist, e.g. by means of an etching process, e.g. a wet lift off or plasma ash process and wet clean. This way, removing S6 a part of the silicon-insulator layer on top of the resist 700 may be removed. Thus, a laterally structured silicon-insulator layer 120 may remain on the substrate 600 where the resist 700 has not covered the substrate 600.

Figure 8:
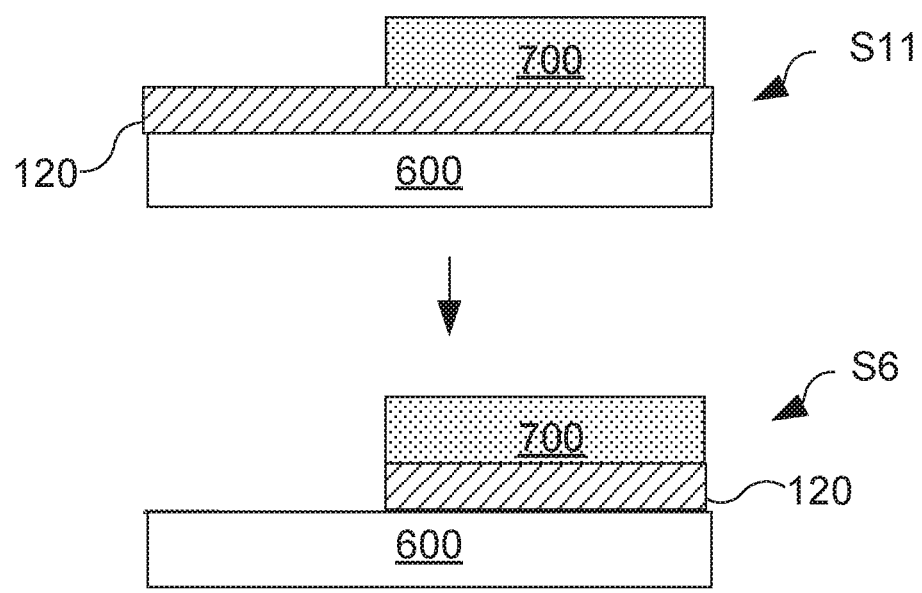
FIG. 8 shows schematic cross section views of a semiconductor device in a method of processing a semiconductor device according to various embodiments.

Alternatively, as illustrated in FIG. 8, a resist 700 may be formed S11 on top of an unstructured silicon-insulator layer 120 and may act as a shielding structure during an etching process. This way, silicon-insulator layer 120 not covered by the resist 700 may be removed in an etching process, e.g. a HF-etching process. Subsequently, the remaining resist 700 may be removed (not illustrated) or may remain on the laterally structured silicon-insulator layer 120, e.g. as a cover or protection layer. This way, a laterally structured silicon-insulator layer 120 may remain on the substrate 600.

Various Examples will be described in the following:

Example 1 is a method of forming a silicon-insulator layer. The method including an arranging of a silicon structure in a plasma etch process chamber. The method further including applying a plasma to the silicon structure in the plasma etch process chamber at a temperature of the silicon structure equal to or below 100° C. The plasma includes a component and a halogen derivate. Thereby, the silicon-insulator layer is formed, wherein the silicon-insulator layer includes silicon and the component.

In Example 2, the method of Example 1 further includes forming a further silicon structure on the silicon insulator layer, and applying a plasma to the further silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component.

In Example 3, the method of Example 2, further includes repeating the process of example 2 at least once.

In Example 4, the method of any one of Examples 1 to 3 includes that the silicon structure is a silicon wafer.

In Example 5, the method of any one of Examples 1 to 4, further includes forming the silicon structure as a silicon layer on a substrate.

In Example 6, the method of Example 5 includes that the substrate includes a native silicon oxide layer; and that the silicon structure is formed on the native silicon oxide layer.

In Example 7, the method of any one of Examples 5 or 6 includes that the substrate includes or consists of at least one metal, e.g. tungsten. The metal may be at the exposed surface on which the silicon structure is formed.

In Example 8, the method of any one of Examples 5 to 7 includes that the substrate includes or consists of at least one semiconducting material, e.g. gallium nitride, germanium carbide, silicone carbide, graphene, graphite, silicon. The semiconducting material may be at the exposed surface on which the silicon structure is formed.

In Example 9, the method of any one of Examples 5 to 8 includes that the substrate includes or consists of at least one dielectric material, e.g. an alumina, a resist, a polymer foil, a glass. The dielectric material may be at the exposed surface on which the silicon structure is formed.

In Example 10, the subject matter of any one of Examples 1 to 9 further includes that the plasma is applied to the silicon structure at a temperature of the silicon structure in the range from about 10° C. to about 90° C.

In Example 11, the subject matter of Example 10 further includes that the plasma is applied to the silicon structure at a temperature of the silicon structure in the range from about 20° C. to about 80° C.

In Example 12, the subject matter of Example 11 further includes that the plasma is applied to the silicon structure at a temperature of the silicon structure in the range from about 20° C. to about 25° C.

In Example 13, the subject matter of any one of Examples 1 to 12 further includes that the component includes or essentially consists of oxygen ions.

In Example 14, the subject matter of any one of Examples 1 to 13 further includes that the component includes or essentially consists of nitrogen ions.

In Example 15, the subject matter of any one of Examples 1 to 14 further includes that the component includes or essentially consists of carbon ions.

In Example 16, the subject matter of any one of Examples 1 to 15 further includes that the halogen derivate includes or essentially consists of fluorine ions.

In Example 17, the subject matter of any one of Examples 1 to 16 further includes that the silicon-insulator layer is formed to have a layer thickness in the range from about 2 nm to about 20 nm, e.g. in a range of about 2 nm to 12 nm.

In Example 18, the subject matter of Example 17 further includes that the silicon-insulator layer is formed to have a layer thickness in the range from about 2 nm to about 10 nm.

In Example 19, the subject matter of Example 18 further includes that the silicon-insulator layer is formed to have a layer thickness in the range from about 2 nm to about 9 nm.

In Example 20, the subject matter of any one of Examples 1 to 19 further includes that the molar concentration of the component in the plasma is higher than the molar concentration of the halogen derivate in the plasma.

In Example 21, the subject matter of any one of Examples 1 to 20 further includes that the silicon structure includes a metal, wherein a metal surface is exposed.

In Example 22, the subject matter of Example 21 further includes that the metal includes or essentially consists of tungsten.

Example 23, is a method of processing a semiconductor device. The method including a forming of a silicon-insulator layer on a first wafer. The forming including an arranging of a silicon structure in a plasma etch process chamber, and applying a plasma to the silicon structure in the plasma etch process chamber at a temperature of the silicon structure equal to or below 100° C. The plasma includes a component and a halogen derivate, thereby forming the silicon-insulator layer. The silicon-insulator layer includes silicon and the component. The method further including an adhering of a second wafer to the first wafer by fixing the silicon-insulator layer to a surface of the second wafer.

In Example 24, the subject matter of Example 23 further includes that the plasma is applied to the silicon structure at a temperature of the silicon structure in the range from about 10° C. to about 90° C.

In Example 25, the subject matter of Example 24 further includes that the plasma is applied to the silicon structure at a temperature of the silicon structure in the range from about 20° C. to about 80° C.

In Example 26, the subject matter of Example 25 further includes that the plasma is applied to the silicon structure at a temperature of the silicon structure in the range from about 20° C. to about 25° C.

In Example 27, the subject matter of any one of Examples 23 to 26 further includes that the component includes or essentially consists of oxygen ions.

In Example 28, the subject matter of any one of Examples 23 to 27 further includes that the component includes or essentially consists of nitrogen ions.

In Example 29, the subject matter of any one of Examples 23 to 28 further includes that the component includes or essentially consists of carbon ions.

In Example 30, the subject matter of any one of Examples 23 to 27 further includes that the halogen derivate includes or essentially consists of fluorine ions.

In Example 31, the subject matter of any one of Examples 23 to 30 further includes that the silicon-insulator layer is formed to have a layer thickness in the range from about 2 nm to about 20 nm, e.g. in a range of about 2 nm to 12 nm.

In Example 32, the subject matter of Example 31 further includes that the silicon-insulator layer is formed to have a layer thickness in the range from about 2 nm to about 10 nm.

In Example 33, the subject matter of Example 31 further includes that the silicon-insulator layer is formed to have a layer thickness in the range from about 2 nm to about 9 nm.

In Example 34, the subject matter of any one of Examples 23 to 33 further includes that the molar concentration of the component in the plasma is higher than the molar concentration of the halogen derivate in the plasma.

In Example 35, the subject matter of any one of Examples 23 to 34 further includes forming a further silicon structure on the silicon insulator layer, and applying a plasma to the further silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component.

In Example 36, the subject matter of any one of Examples 23 to 35 further includes repeating the process of example 35 at least once.

In Example 37, the subject matter of any one of Examples 23 to 36 includes that the silicon structure is a silicon wafer.

In Example 38, the subject matter of any one of Examples 23 to 37 further includes forming the silicon structure as a silicon layer on a substrate.

In Example 39, the method of Example 38 includes that the substrate includes a native silicon oxide layer; and that the silicon structure is formed on the native silicon oxide layer.

In Example 40, the method of any one of Examples 38 or 39 includes that the substrate includes or consists of at least one metal, e.g. tungsten. The metal may be at the exposed surface on which the silicon structure is formed.

In Example 41, the method of any one of Examples 38 to 40 includes that the substrate includes or consists of at least one semiconducting material, e.g. gallium nitride, germanium carbide, silicone carbide, graphene, graphite, silicon. The semiconducting material may be at the exposed surface on which the silicon structure is formed.

In Example 42, the method of any one of Examples 38 to 41 includes that the substrate includes or consists of at least one dielectric material, e.g. an alumina, a resist, a polymer foil, a glass. The dielectric material may be at the exposed surface on which the silicon structure is formed.

Example 43, is a method of processing a semiconductor device. The method includes a forming of a silicon-insulator layer on a semiconductor surface. The forming includes an arranging of a silicon structure in a plasma etch process chamber and an applying a plasma to the silicon structure in the plasma etch process chamber at a temperature of the silicon structure equal to or below 100° C. The plasma includes a component and a halogen derivate, thereby forming the silicon-insulator layer. The silicon-insulator layer includes silicon and the component. The method further includes an at least partially removing of the silicon-insulator layer from the semiconductor surface. In other words: a laterally structured silicon-insulator layer may be formed by removing a part of the silicon-insulator layer.

In Example 44, the subject matter of Example 43 further includes that the plasma is applied to the silicon structure at a temperature of the silicon structure in the range from about 10° C. to about 90° C.

In Example 45, the subject matter of Example 44 further includes that the plasma is applied to the silicon structure at a temperature of the silicon structure in the range from about 20° C. to about 80° C.

In Example 46, the subject matter of Example 45 further includes that the plasma is applied to the silicon structure at a temperature of the silicon structure in the range from about 20° C. to about 25° C.

In Example 47, the subject matter of any one of Examples 43 to 46 further includes that the component includes or essentially consists of oxygen ions.

In Example 48, the subject matter of any one of Examples 43 to 47 further includes that the component includes or essentially consists of nitrogen ions.

In Example 49, the subject matter of any one of Examples 43 to 48 further includes that the component includes or essentially consists of carbon ions.

In Example 50, the subject matter of any one of Examples 43 to 49 further includes that the halogen derivate includes or essentially consists of fluorine ions.

In Example 51, the subject matter of any one of Examples 43 to 50 further includes that the silicon-insulator layer is formed to have a layer thickness in the range from about 2 nm to about 20 nm, e.g. in a range of about 2 nm to 12 nm.

In Example 52, the subject matter of Example 51 further includes that the silicon-insulator layer is formed to have a layer thickness in the range from about 2 nm to about 10 nm.

In Example 53, the subject matter of Example 52 further includes that the silicon-insulator layer is formed to have a layer thickness in the range from about 2 nm to about 9 nm.

In Example 54, the subject matter of any one of Examples 43 to 53 further includes that the molar concentration of the component in the plasma is higher than the molar concentration of the halogen derivate in the plasma.

In Example 55, the subject matter of any one of Examples 43 to 54 further includes forming a further silicon structure on the silicon insulator layer, and applying a plasma to the further silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component.

In Example 56, the subject matter of any one of Examples 43 to 55 further includes repeating the process of example 55 at least once.

In Example 57, the subject matter of any one of Examples 43 to 56 includes that the silicon structure is a silicon wafer.

In Example 58, the subject matter of any one of Examples 43 to 57 further includes forming the silicon structure as a silicon layer on a substrate.

In Example 59, the method of Example 38 includes that the substrate includes a native silicon oxide layer; and that the silicon structure is formed on the native silicon oxide layer.

In Example 60, the method of any one of Examples 58 or 59 includes that the substrate includes or consists of at least one metal, e.g. tungsten. The metal may be at the exposed surface on which the silicon structure is formed.

In Example 61, the method of any one of Examples 58 to 60 includes that the substrate includes or consists of at least one semiconducting material, e.g. gallium nitride, germanium carbide, silicone carbide, graphene, graphite, silicon. The semiconducting material may be at the exposed surface on which the silicon structure is formed.

In Example 62, the method of any one of Examples 58 to 61 includes that the substrate includes or consists of at least one a dielectric material, e.g. an alumina, a resist, a polymer foil. The dielectric material may be at the exposed surface on which the silicon structure is formed.

Example 63, is a method of forming a semiconductor device, the method including a forming of a silicon-insulator layer on a semiconductor surface. The forming including an arranging a silicon structure in a plasma etch process chamber and an applying a plasma to the silicon structure in the plasma etch process chamber at a temperature of the silicon structure equal to or below 100° C. The plasma includes a component and a halogen derivate, thereby forming the silicon-insulator layer. The silicon-insulator layer including silicon and the component. The method further including a forming of a first controlled region, a second controlled region and a control region of the semiconductor device.

In Example 64, the subject matter of Example 63 further includes that the semiconductor device is a transistor.

In Example 65, the subject matter according to any one of Examples 63 to 64 further includes that the transistor is a field effect transistor; and the first controlled region is formed as a source region of the field effect transistor. The second controlled region is formed as a drain region of the field effect transistor. The control region is formed as a gate region of the field effect transistor.

In Example 66, the subject matter of any one of Examples 63 to 65 further includes that the plasma is applied to the silicon structure at a temperature of the silicon structure in the range from about 10° C. to about 90° C.

In Example 67, the subject matter of Example 66 further includes that the plasma is applied to the silicon structure at a temperature of the silicon structure in the range from about 20° C. to about 80° C.

In Example 68, the subject matter of Example 66 further includes that the plasma is applied to the silicon structure at a temperature of the silicon structure in the range from about 20° C. to about 25° C.

In Example 69, the subject matter of any one of Examples 63 to 68 further includes that the component includes or essentially consists of oxygen ions.

In Example 70, the subject matter of any one of Examples 63 to 69 further includes that the component includes or essentially consists of nitrogen ions.

In Example 71, the subject matter of any one of Examples 63 to 70 further includes that the component includes or essentially consists of carbon ions.

In Example 72, the subject matter of any one of Examples 63 to 71 further includes that the halogen derivate includes or essentially consists of fluorine ions.

In Example 73, the subject matter of any one of Examples 63 to 72 further includes that the silicon-insulator layer is formed to have a layer thickness in the range from about 2 nm to about 12 nm, e.g. in a range of about 2 nm to 20 nm.

In Example 74, the subject matter of Example 73 further includes that the silicon-insulator layer is formed to have a layer thickness in the range from about 2 nm to about 10 nm.

In Example 75, the subject matter of Example 74 further includes that the silicon-insulator layer is formed to have a layer thickness in the range from about 2 nm to about 9 nm.

In Example 76, the subject matter of any one of Examples 63 to 75 further includes that the molar concentration of the component in the plasma is higher than the molar concentration of the halogen derivate in the plasma.

In Example 77, the subject matter of any one of Examples 63 to 76 further includes that the silicon structure includes a metal, wherein a metal surface is exposed.

In Example 78, the subject matter of Example 77 further includes that the metal includes or essentially consists of tungsten.

In Example 79, the subject matter of any one of Examples 63 to 78 further includes that the metal forms the control region of the semiconductor device.

In Example 80, the subject matter of any one of Examples 63 to 79 further includes forming a further silicon structure on the silicon insulator layer, and applying a plasma to the further silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component.

In Example 81, the subject matter of any one of Examples 63 to 79 further includes repeating the process of example 80 at least once.

In Example 82, the subject matter of any one of Examples 63 to 81 includes that the silicon structure is a silicon wafer.

In Example 83, the subject matter of any one of Examples 63 to 82 further includes forming the silicon structure as a silicon layer on a substrate.

In Example 84, the subject matter of Example 83 includes that the substrate includes a native silicon oxide layer; and that the silicon structure is formed on the native silicon oxide layer.

In Example 85, the subject matter of any one of Examples 83 or 84 includes that the substrate includes or consists of at least one metal, e.g. tungsten. The metal may be at the exposed surface on which the silicon structure is formed.

In Example 86, the subject matter of any one of Examples 83 to 85 includes that the substrate includes or consists of at least one semiconducting material, e.g. gallium nitride, germanium carbide, silicone carbide, graphene, graphite, silicon. The semiconducting material may be at the exposed surface on which the silicon structure is formed.

In Example 87, the subject matter of any one of Examples 83 to 86 includes that the substrate includes or consists of at least one dielectric material, e.g. an alumina, a resist, a polymer foil, a glass. The dielectric material may be at the exposed surface on which the silicon structure is formed.

Example 88, is a semiconductor structure including a silicon structure including a metal portion, wherein a metal surface of the metal portion is free from a metal insulating compound. The semiconductor structure further including a silicon-insulator layer adjacent to the metal portion, wherein a top surface of the silicon-insulator layer is higher than the metal surface, wherein the silicon-insulator layer forms a sharp edge with respect to the metal surface so that the metal surface of the metal portion is also free from the silicon-insulator layer.

In Example 89, the subject matter of Example 88 further includes that the metal insulating compound includes or essentially consists of a metal oxide.

In Example 90, the subject matter of Example 88 or 89 further includes that the metal insulating compound includes or essentially consists of a metal nitride.

In Example 91, the subject matter of any one of Examples 88 to 90 further includes that the metal insulating compound includes or essentially consists of a metal oxynitride.

In Example 92, the subject matter of any one of Examples 88 to 91 further includes that the silicon-insulator compound includes or essentially consists of a silicon oxide.

In Example 93, the subject matter of any one of Examples 88 to 92 further includes that the silicon-insulator compound includes or essentially consists of a silicon nitride.

In Example 94, the subject matter of any one of Examples 88 to 93 further includes that the silicon-insulator compound includes or essentially consists of a silicon oxynitride.

In Example 95, the subject matter of any one of Examples 88 to 94 further includes that the silicon-insulator layer has a layer thickness in the range from about 2 nm to about 20 nm, e.g. in the range from about 2 nm to about 12 nm.

In Example 96, the subject matter of Example 95 further includes that the silicon-insulator layer has a layer thickness in the range from about 2 nm to about 10 nm.

In Example 97, the subject matter of Example 96 further includes that the silicon-insulator layer has a layer thickness in the range from about 2 nm to about 9 nm.

In Example 98, the subject matter of any one of Examples 88 to 97 further includes that the metal portion forms a control region of the semiconductor device.

In Example 99, the subject matter of Example 98 further includes that the semiconductor device is a transistor; and that the metal portion forms a control region of the transistor.

In Example 100, the subject matter of Example 98 or 99 further includes that the semiconductor device is a field effect transistor; and that the metal portion forms a gate region of the field effect transistor.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a silicon-insulator layer, the method comprising:
    arranging a silicon structure in a plasma etch process chamber;
    applying a plasma to the silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component;
    forming a further silicon structure on the silicon-insulator layer; and
    applying a plasma to the further silicon structure in the plasma etch process chamber at a temperature of the silicon structure equal to or below 100° C., wherein the plasma comprises a component and a halogen derivate, thereby forming the silicon-insulator layer, the silicon-insulator layer comprising silicon and the component.

2. The method of claim 1, further comprising:
repeating, at least once, the forming of a further silicon structure on the silicon-insulator layer and the applying of a plasma to the further silicon structure.

3. The method of claim 1, wherein the silicon structure is a silicon wafer.

4. The method of claim 1, further comprising:
forming the silicon structure as a silicon layer on a substrate.

5. The method of claim 4, wherein the substrate comprises a native silicon oxide layer, and wherein the silicon structure is formed on the native silicon oxide layer.

6. The method of claim 4, wherein the substrate comprises at least one material selected from the group consisting of: a metal; a semiconducting material; and a dielectric material.

7. The method of claim 1, further comprising:
removing a part of the silicon-insulator layer to form a laterally structured silicon-insulator layer.

8. The method of claim 1, wherein the plasma is applied to the silicon structure at a temperature of the silicon structure in the range from about 10° C. to about 90° C.

9. The method of claim 1, wherein the component comprises oxygen ions.

10. The method of claim 1, wherein the component comprises nitrogen ions.

11. The method of claim 1, wherein the halogen derivate comprises fluorine ions.

12. The method of claim 1, wherein the silicon-insulator layer is formed to have a layer thickness in the range from about 2 nm to about 20 nm.

13. The method of claim 1, wherein a molar concentration of the component in the plasma is higher than a molar concentration of the halogen derivate in the plasma.

14. The method of claim 1, wherein the silicon structure comprises a metal having an exposed surface.

15. The method of claim 14, wherein the metal comprises tungsten.

* * * * *